United States Patent
Johnson et al.

(10) Patent No.: US 11,034,865 B2
(45) Date of Patent: *Jun. 15, 2021

(54) NANOPARTICLE FILLED BARRIER ADHESIVE COMPOSITIONS

(71) Applicant: 3M INNOVATIVE PROPERTIES COMPANY, St. Paul, MN (US)

(72) Inventors: Jacob P. Johnson, St. Paul, MN (US); Adam J. Meuler, Woodbury, MN (US); Serena L. Schleusner, Roberts, WI (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 268 days.

This patent is subject to a terminal disclaimer.

(21) Appl. No.: 16/309,835

(22) PCT Filed: Jun. 13, 2017

(86) PCT No.: PCT/US2017/037197
§ 371 (c)(1),
(2) Date: Dec. 13, 2018

(87) PCT Pub. No.: WO2017/218500
PCT Pub. Date: Dec. 21, 2017

(65) Prior Publication Data
US 2020/0181460 A1    Jun. 11, 2020

Related U.S. Application Data

(60) Provisional application No. 62/351,116, filed on Jun. 16, 2016.

(51) Int. Cl.
| | | |
|---|---|---|
| C09J 7/30 | (2018.01) |
| C09J 7/40 | (2018.01) |
| C09J 11/04 | (2006.01) |
| C09J 123/20 | (2006.01) |
| H01L 51/50 | (2006.01) |
| H05B 33/04 | (2006.01) |
| C08K 9/04 | (2006.01) |
| C09J 7/38 | (2018.01) |
| C09J 7/24 | (2018.01) |
| C09J 123/22 | (2006.01) |
| H01L 51/52 | (2006.01) |
| C08K 3/34 | (2006.01) |
| C08K 5/00 | (2006.01) |
| C08K 3/22 | (2006.01) |

(52) U.S. Cl.
CPC ............ C09J 7/383 (2018.01); C09J 7/243 (2018.01); C09J 7/40 (2018.01); C09J 123/22 (2013.01); H01L 51/5237 (2013.01); C08K 3/346 (2013.01); C08K 5/005 (2013.01); C08K 2003/2206 (2013.01); C08K 2201/005 (2013.01)

(58) Field of Classification Search
None
See application file for complete search history.

(56) References Cited

U.S. PATENT DOCUMENTS

| | | |
|---|---|---|
| 4,696,719 A | 9/1987 | Bischoff |
| 4,722,515 A | 2/1988 | Ham |
| 4,842,893 A | 6/1989 | Yializis |
| 4,954,371 A | 9/1990 | Yializis |
| 5,018,048 A | 5/1991 | Shaw |
| 5,032,461 A | 7/1991 | Shaw |
| 5,097,800 A | 3/1992 | Shaw |
| 5,125,138 A | 6/1992 | Shaw |
| 5,440,446 A | 8/1995 | Shaw |
| 5,547,908 A | 8/1996 | Furuzawa |
| 5,916,685 A | 6/1999 | Frisk |
| 6,045,864 A | 4/2000 | Lyons |
| 6,214,422 B1 | 4/2001 | Yializis |
| 6,231,939 B1 | 5/2001 | Shaw |
| 6,936,131 B2 | 8/2005 | McCormick |
| 6,936,161 B2 | 8/2005 | Wright |

(Continued)

FOREIGN PATENT DOCUMENTS

| | | |
|---|---|---|
| GB | 1244208 | 8/1991 |
| JP | 2012-193335 | 10/2012 |

(Continued)

OTHER PUBLICATIONS

Shaw, "A New Vapor Deposition Process for Coating Paper and Polymer Webs", 6th International Vacuum Web Coating Conference, Oct. 28, 1992, pp. 18-24.

Shaw, "A New High-Speed Process for Vapor Depositing Acrylate Thin Films: An Update", Society of Vacuum Coaters, 36th Annual Technical Conference Proceedings, 1993, pp. 348-351.

Shaw, "Use of Vapor Deposited Acrylate Coatings to Improve the Barrier Properties of Metallized Film", Society of Vacuum Coaters, 37th Annual Technical Conference Proceedings, 1994, pp. 240-247.

(Continued)

*Primary Examiner* — Sheeba Ahmed
(74) *Attorney, Agent, or Firm* — Lisa P. Fulton

(57) ABSTRACT

Provided is a barrier adhesive composition comprises polyisobutylene resin, organically modified nanoclay (e.g. montmorillonite or bentonite) and sorbent nanoparticles (e.g. CaO which acts as a desiccant and/or getter). In a preferred embodiment, the barrier adhesive composition is disposed on a gas-barrier film to form an adhesive barrier film. The adhesive barrier film can then be used for protection from oxygen and moisture in OLED displays and solid state lightings, solar cells, electrophoretic and electrochromic displays thin film batteries, quantum dot devices, sensors (e.g. touch sensor) and other organic electronic devices. The adhesive barrier film is especially well-suited for applications that require oxygen and moisture protection as well flexibility and good optical transmittance.

26 Claims, 2 Drawing Sheets

(56) References Cited

U.S. PATENT DOCUMENTS

| | | |
|---|---|---|
| 7,940,004 B2 | 5/2011 | Padiyath |
| 8,232,350 B2 | 7/2012 | Fujita |
| 8,742,411 B2 | 6/2014 | Yoo |
| 8,786,186 B2 | 7/2014 | Son |
| 8,834,618 B2 | 9/2014 | Baran, Jr. |
| 10,581,015 B2 * | 3/2020 | Johnson .............. H01L 51/5253 |
| 10,738,224 B2 * | 8/2020 | Johnson ................. C08K 3/346 |
| 2010/0089636 A1 | 4/2010 | Ramadas |
| 2012/0059074 A1 * | 3/2012 | Adkinson ............... B29B 17/04 521/41.5 |
| 2014/0138131 A1 * | 5/2014 | Hao ........................ G06F 3/041 174/257 |
| 2014/0331601 A1 * | 11/2014 | Jorissen ............. C09J 123/0815 53/400 |
| 2014/0377554 A1 | 12/2014 | Cho |
| 2015/0162568 A1 | 6/2015 | Bai |
| 2016/0017197 A1 | 1/2016 | Mieda |

FOREIGN PATENT DOCUMENTS

| | | |
|---|---|---|
| JP | 2015-191799 | 11/2015 |
| WO | WO 2000-26973 | 5/2000 |

OTHER PUBLICATIONS

Shaw, "Use of Evaporated Acrylate Coatings to Smooth the Surface of Polyester and Polypropylene Film Substrates", RadTech'96 North America UV/EB Conference Proceedings, Apr. 28-May 2, 1996, vol. 2, pp. 701-707.

Affinito, "Vacuum deposited polymer/metal multilayer films for optical application", Thin Solid Films, 1995, vol. 270, pp. 43-48.

Affinito, "Polymer-Oxide Transparent Barrier Layers", Society of Vacuum Coaters, 39th Annual Technical Conference Proceedings, 1996, pp. 1-6.

International Search Report for PCT International Application No. PCT/US2017/037197, dated Sep. 11, 2017, 5 pages.

\* cited by examiner

NANOPARTICLE FILLED BARRIER ADHESIVE COMPOSITIONS

FIELD

This invention relates to barrier adhesive compositions and to adhesive barrier films.

BACKGROUND

Organic electronic devices require protection from moisture and oxygen in order to provide adequately long lifetimes for commercial applications. An encapsulant is therefore utilized to protect the device from contact with moisture and oxygen. Glass is one commonly used encapsulant, but glass significantly impairs the flexibility of the device. It can therefore be desirable to replace glass with flexible barrier films. Flexible barrier films can enable flexible devices as well as lighter, thinner, more rugged rigid devices.

Flexible barrier films have been commercialized for general use in organic electronic devices. A flexible barrier film is typically laminated to the device it will protect using an adhesive. It is therefore important that the adhesive also have good barrier properties to minimize moisture and oxygen bond line edge ingress. Some barrier adhesives such as those described, for example, in U.S. Patent Application Pub. No. US 2014/0377554 (Cho et al.) include nanoclays as a "moisture blocker". Other barrier adhesives such as those described, for example, in U.S. Pat. No. 6,936,131 (McCormick et al.) include desiccants and/or getter materials to absorb and/or adsorb oxygen and/or moisture.

SUMMARY

In view of the foregoing, we recognize that for particularly demanding organic electronic device applications such as, for example, long lifetime organic light emitting diode (OLED) displays, improved barrier adhesives are needed.

Briefly, in one aspect, the present invention provides barrier adhesive compositions comprising polyisobutylene resin, organically modified nanoclay and sorbent nanoparticles.

As used herein, the term "sorbent" refers to materials used to absorb or adsorb liquids or gases such as oxygen or moisture.

In another aspect, the present invention provides barrier adhesive compositions comprising about 50 to about 75 wt. % polyisobutylene resin having a viscosity average molecular weight of about 300,000 to about 900,000 g/mol, about 1 to about 10 wt. % organically modified nanoclay, about 1 to about 5 wt. % calcium oxide nanoparticles, and about 10 to about 25 wt. % tackifier, all relative to the total weight of the composition.

In yet another aspect, the present invention provides adhesive barrier films comprising a layer of the barrier adhesive composition of the invention disposed on a gas-barrier film as well as barrier adhesive articles comprising a layer of the barrier adhesive composition of the invention disposed between release layers.

It has been found that the polyisobutylene adhesive compositions of the invention, which are filled with nanoclay and sorbent nanoparticles, provide a significant improvement in barrier properties as compared to unfilled polyisobutylene adhesives or to polyisobutylene adhesives filled with one of either nanoclay or sorbent nanoparticles. Surprisingly, this improvement is observed even as compared to a polyisobutylene adhesive with higher loadings of one of either nanoclay or sorbent nanoparticles.

DETAILED DESCRIPTION

Figure 1:
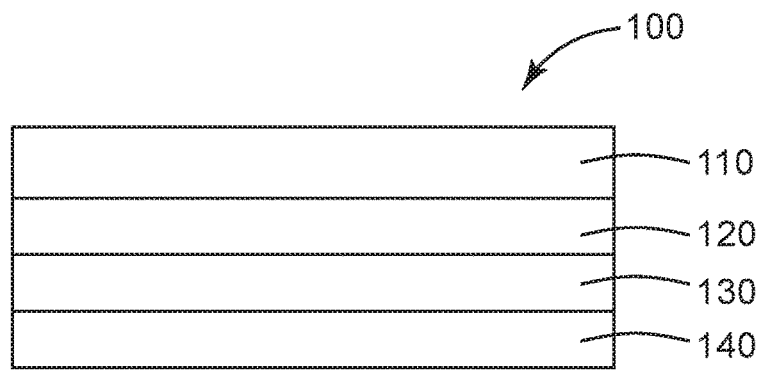
FIG. 1 is a schematic representation of a barrier film construction.

The barrier adhesive compositions of the invention comprise polyisobutylene resin. The polyisobutylene resin typically has a viscosity average molecular weight of about 40,000 to about 2,600,000 g/mol. In some embodiments, the polyisobutylene resin has a viscosity average molecular weight of about 300,000 to about 900,000 g/mol. In some embodiments, the resin system comprises a blend of a first polyisobutylene resin having a viscosity average molecular weight of about 300,000 to about 500,000 g/mol, about 350,000 to about 450,000 g/mol, or about 400,000 g/mol and (b) a second polyisobutylene resin has a viscosity average molecular weight of about 700,000 to about 900,000 g/mol, about 650,000 g/mol to about 850,000 g/mol, or about 800,000 g/mol.

The viscosity average molecular weight (Mg) is typically based on the Staudinger index. The Staudinger index Jo ($cm^3/g$) is calculated from the flow time at 20° C. through capillary I of an Ubbelohde viscometer.

$$J_o = \eta_{sp}/c(1+0.31 \times \eta_{sp}) cm^3/g \text{ (Schulz-Blaschke equation)}$$

$$\eta_{sp} = t/t_o - 1 \text{ (specific viscosity)}$$

t=flow time of the solution, with Hagenbach-Couette correction $t_o$=flow time of the solvent, with Hagenbach-Couette correction c=concentration of the solution in $g/cm^3$ The viscosity-average molecular weight is calculated according to the formula $J_o = 3.06 \times 10^{-2} \times M_v^{0.65}$ In some embodiments, the resin system comprises about 65 to about 85 wt. % of polyisobutylene resin relative to the total weight of the resin system. In some embodiments, the resin system comprises about 15 to about 35 wt. %, about 20 to about 30 wt. %, or about 25 wt. %, of the first polyisobutylene resin relative to the total weight of the resin system. In some embodiments, the resin system comprises about 40 to about 60 wt. %, about 45 to about 55 wt. %, or about 50 wt. %, of the second polyisobutylene resin relative to the total weight of the resin system.

The polyisobutylene resins are generally resins having a polyisobutylene resin skeleton in the main or a side chain. In some embodiments, the polyisobutylene resins are substantially homopolymers of isobutylene such as, for example, polyisobutylene resins available under the tradenames of OPPANOL (BASF AG) and GLISSO-PAL (BASF AG). Examples of suitable commercially available polyisobutylene resins include OPPANOL B15 (Mv=85,000), OPPANOL B50 (Mv=400,000), OPPANOL B50SF with stabilizer (Mv=400,000), OPPANOL N50 (Mv=425,000), OPPANOL N50SF with stabilizer (Mv=425,000), OPPANOL B80 (Mv=800,000) and OPPANOL N80 (Mv=800,000). In some embodiments, the polyisobutylene resins comprise copolymers of isobutylene such as, for example, synthetic rubbers wherein isobutylene is copolymerized with another monomer. Synthetic rubbers include butyl rubbers which are copolymers of mostly isobutylene with a small amount of isoprene such as, for example, butyl rubbers available under the tradenames VISTANEX (Exxon Chemical Co.) and JSR BUTYL (Japan Butyl Co., Ltd.). Synthetic rubbers also include copolymers of mostly isobutylene with styrene, n-butene or butadiene. In some embodiments, a mixture of isobutylene homopolymer and butyl rubber may be used. Other useful copolymers include styrene-isobutylene diblock Copolymer (SIB) and styrene-isobutylene-styrene triblock copolymer (SIBS), available under the tradename SIBSTAR (Kaneka Corporation).

For example, the first polyisobutylene resin can comprise a homopolymer of isobutylene and the second polyisobutylene can comprise butyl rubber, or the first polyisobutylene can comprise butyl rubber and the second polyisobutylene can comprise a homopolymer of isobutylene. The first and second polyisobutylene resins may each comprise more than one resin.

The polyisobutylene resins generally have a solubility parameter (SP value), which is an index for characterizing the polarity of a compound, that is similar to that of hydrogenated cycloaliphatic hydrocarbon resins, and exhibits good compatibility (i.e., miscibility) with hydrogenated cycloaliphatic hydrocarbon resins, if used, so that a transparent film can be formed. Furthermore, the polyisobutylene resins have low surface energy and therefore can enable spreadability of the adhesive onto an adherent and the generation of voids at the interface is minimized. In addition, the glass transition temperature and the moisture permeability are low and therefore, the polyisobutylene resins are suitable as the base resin of the adhesive encapsulating composition.

The polyisobutylene resins may have desirable viscoelastic properties that, in general, can be used to impart a desired degree of fluidity to the adhesive encapsulating composition. A strain rheometer may be used to determine elastic (storage) modulus, G', and viscous (loss) modulus, G", at various temperatures. G' and G" can then be used to determine the ratio tan($\square$)=G"/G'. In general, the higher the tan($\square$) value, the more the material is like a viscous material, and the lower the tan($\square$) value, the more the material is like an elastic solid. In some embodiments, the polyisobutylene resin may be selected such that the adhesive encapsulating composition has a tan($\square$) value at relatively low frequency of at least about 0.5 when the composition is at temperatures of from about 70° C. to about 110° C. In this way, the composition is able to flow sufficiently over uneven surfaces with little or no air entrapment.

The barrier adhesive compositions of the invention can optionally also include a tackifier. In general, a tackifier can be any compound or mixture of compounds that increases the tackiness of the adhesive encapsulating composition. Desirably, the tackifier does not increase moisture permeability. The tackifier may comprise a hydrogenated hydrocarbon resin, a partially hydrogenated hydrocarbon resin, a non-hydrogenated hydrocarbon resin, or a combination thereof. Preferably, the tackifier comprises a hydrogenated petroleum resin. In some embodiments, the adhesive composition comprises about 15 to about 35 wt. %, about 20 to about 30 wt. %, or about 25 wt. %, of the tackifer relative to the total weight of the composition.

Examples of tackifiers include, but are not limited to, hydrogenated terpene-based resins (for example, resins commercially available under the trade designation CLEARON P, M and K (Yasuhara Chemical)); hydrogenated resins or hydrogenated ester-based resins (for example, resins commercially available under the trade designation FORAL AX (Hercules Inc.); FORAL 105 (Hercules Inc.); PENCEL A (Arakawa Chemical Industries. Co., Ltd.); ESTERGUM H (Arakawa Chemical Industries Co., Ltd.); and SUPER ESTER A (Arakawa Chemical Industries. Co., Ltd.); disproportionate resins or disproportionate ester-based resins (for example, resins commercially available under the trade designation PINECRYSTAL (Arakawa Chemical Industries Co., Ltd.); hydrogenated dicyclopentadiene-based resins which are hydrogenated resins of a C5-type petroleum resin obtained by copolymerizing a C5 fraction such as pentene, isoprene, piperine and 1,3-pentadiene produced through thermal decomposition of petroleum naphtha (for example, resins commercially available under the trade designations ESCOREZ 5300 and 5400 series (Exxon Chemical Co.); EASTOTAC H (Eastman Chemical Co.)); partially hydrogenated aromatic modified dicyclopentadiene-based resins (for example, resins commercially available under the trade designation ESCOREZ 5600 (Exxon Chemical Co.)); resins resulting from hydrogenation of a C9-type petroleum resin obtained by copolymerizing a C9 fraction such as indene, vinyltoluene and α- or β-methylstyrene produced by thermal decomposition of petroleum naphtha (for example, resins commercially available under the trade designation ARCON P or ARCON M (Arakawa Chemical Industries Co., Ltd.)); resins resulting from hydrogenation of a copolymerized petroleum resin of the above-described C5 fraction and C9 fraction (for example, resin commercially available under the trade designation IMARV (Idemitsu Petrochemical Co.)).

Non-hydrogenated hydrocarbon resins include C5, C9, C5/C9 hydrocarbon resins, polyterpene resins, aromatics-modified polyterpene resins or rosin derivatives. If a non-hydrogenated hydrocarbon resin is used, it is typically used in combination with another hydrogenated or partially hydrogenated tackifier.

In some embodiments, the tackifier comprises a hydrogenated hydrocarbon resin, and particularly, a hydrogenated cycloaliphatic hydrocarbon resin. A specific example of a hydrogenated cycloaliphatic hydrocarbon resin includes ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mol. In another embodiment, the weight average molecular weight of the hydrogenated cycloaliphatic hydrocarbon resin is from about 500 to 3,000 g/mol. If the weight average molecular weight exceeds 5,000 g/mol, poor tackification may result or the compatibility with the polyisobutylene resin may decrease.

The tackifier may have a softening temperature or point (ring and ball softening temperature) that may vary, depending at least in part, upon the adhesion of the composition, the temperature utilized, the ease of production, and the like. The ring and ball softening temperature can generally be from about 50 to 200° C. In some embodiments, the ring and ball softening temperature is from about 80 to 150° C. If the ring and ball softening temperature is less than 80° C., the tackifier may undergo separation and liquefaction due to heat generated upon the emission of light by the electronic device. This can cause deterioration of an organic layer such as a light-emitting layer when an organic electroluminescent device is encapsulated directly with an adhesive encapsulating composition. On the other hand, if the ring and ball softening point exceeds 150° C., the amount of tackifier added is so low that satisfactory improvement of relevant characteristics may not be obtained.

In some embodiments, the tackifier comprises a hydrogenated hydrocarbon resin, and particularly, a hydrogenated cycloaliphatic hydrocarbon resin. Specific examples of hydrogenated cycloaliphatic hydrocarbon resin include ESCOREZ 5300 and ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mol. In another embodiment, the weight average molecular weight of the hydrogenated cycloaliphatic hydrocarbon resin is from about 500 to 3,000 g/mol. If the weight average molecular weight exceeds 5,000 g/mol, poor tackification may result or the compatibility with the polyisobutylene resin may decrease.

The barrier adhesive compositions of the invention include organically modified nanoclay. The nanoclay is typically a cation-substitutable mineral that has been treated with an organic modifier for compatibility with the resin system. In some embodiments, the nanoclay is about 100 to about 1000 nm in its longest dimension.

Suitable nanoclays materials include, for example, those in the geological classes of the smectites, the kaolins, the illites, the chlorites, the serpentines, the attapulgites, the palygorskites, the vermiculites, the glauconites, the sepiolites, and the mixed layer clays. Smectites, for example, can include montmorillonite, bentonite, pyrophyllite, hectorite, saponite, sauconite, nontronite, talc, beidellite, and volchonskoite. Kaolins, for example, can include kaolinite, dickite, nacrite, antigorite, anauxite, halloysite, indellite and chrysotile. Illites, for example, include bravaisite, muscovite, paragonite, phlogopite and biotite. Chlorites, for example, can include corrensite, penninite, donbassite, sudoite, pennine and clinochlore. Mixed layer clays, for example, can include allevardite and vermiculitebiotite. Variants and isomorphic substitutions of these layered clay minerals offer unique applications. Preferably, montmorillonite, bentonite or a combination thereof is used.

Suitable organic modifiers for the clay include, for example, one having a dimethyl benzyl hydrogenated tallow quaternary ammonium ion, a bis(hydrogenated tallow) dimethyl quaternary ammonium ion, a methyl tallow bis-2-hydroxyethyl quaternary ammonium ion, a dimethyl hydrogenated tallow 2-ethylhexyl quaternary ammonium ion or a dimethyl dehydrogenated tallow quaternary ammonium ion.

The barrier adhesive composition typically comprises about 1 to about 10 wt. %, or about 2 to about 5 wt. % of the organically modified nanoclay relative to the total weight of the composition.

The barrier adhesive compositions of the invention also include sorbent nanoparticles such as nano-sized desiccants and/or getters to adsorb and/or absorb oxygen and/or moisture.

Examples of suitable desiccants include dehydrated metal halides, salts, silicates, oxides, hydroxides, halides, sulfates, perchlorates, carbonates and activated carbon. Specific examples include cobalt chloride, calcium chloride, calcium bromide, lithium chloride, zinc chloride, zinc bromide, silicon dioxide (silica gel), aluminum oxide (activated alumina), calcium sulfate, copper sulfate, potassium carbonate, magnesium carbonate, titanium dioxide, bentonite, acidic clay, montmorillonite, diatomaceous earth (clay mineral) silica alumina, zeolite, silica, zirconia, activated carbon, phosphorous pentoxide, magnesium sulfate and alkaline earth oxides such as barium oxide, calcium oxide, iron oxide and magnesium oxide.

Examples of suitable getters include finely divided metals such as Al, Fe, Mg and Mn.

In some embodiments, calcium oxide is a preferred sorbent material. In some embodiments, the sorbent materials have an average particle size of no greater than about 200 nm, e.g., about 1 nm to about 200 nm.

The barrier adhesive composition typically comprise about 0.5 to about 10 wt. % or about 1 to about 5 wt. % of the sorbent nanoparticles relative to the total weight of the composition.

In some embodiments, the barrier adhesive compositions of the invention are solvent-based adhesives. Any useful solvent that dissolves the resins may be utilized. Examples of suitable solvents include heptane, toluene, xylene, benzene, ethylbenzene and hexane (preferably, heptane, toluene or a combination thereof). Is some embodiments, it can be preferable that the solvent has a boiling point below about 200° C.

In some embodiments the solvent comprises about 40 to about 95 wt. %, about 65 to about 95 wt. %, about 70 to about 90 wt. %, about 75 to about 85 wt. %, or about 80 wt. %, of the total barrier adhesive composition.

The barrier adhesive compositions of the invention can be prepared by various methods known to those of skill in the art. For example, the barrier adhesive compositions can be prepared by thoroughly mixing the above-described components. For mixing the composition, an arbitrary mixer such as a kneader or an extruder can be used. In some embodiments, the compositions may be prepared, for example, by preparing a mixture of the resin system with solvent, dispersing the organically modified nanoclay and sorbent nanoparticles into solvent and then combining the resin mixture with the nanoparticle dispersion.

The barrier adhesive compositions of the invention exhibit good visible light transmittance and low haze. In some embodiments, the barrier adhesive composition has a visible light transmittance of about 90% or greater. In some embodiments, the barrier adhesive composition has a haze of about 3% or less.

The barrier adhesive compositions of the invention are typically non-curable or non-reactive compositions. Non-curable compositions are advantageous because they do not require the use of migratory species such as initiators. They also eliminate the need for high temperature curing, which can damage the underlying device. The compositions can be, for example, solvent-based drying adhesives, pressure-sensitive adhesives, contact adhesives or hot melt adhesives. Preferably, the compositions are solvent-based drying adhesives that harden upon drying. As the solvent evaporates, the viscosity of the increases and the adhesive composition hardens.

The barrier adhesive compositions of the invention can be applied to a substrate, a device or any device components by any useful coating process. Solvent based drying adhesives are typically applied by brush, roller, bead or ribbon, or spray. The barrier adhesive composition can be coated onto an appropriate substrate to form a barrier adhesive article.

The barrier adhesive composition can, for example, be coated onto a gas-barrier film and allowed to dry to form an adhesive barrier film. Gas-barrier films have a low permeability to oxygen and can be used to help prevent goods such as foods, electronics and pharmaceutical products from being deteriorated by contact with oxygen. Typically food grade gas-barrier films have oxygen transmission rates of less than about 1 $cm^3/m^2$/day at 20° C. and 65% relative humidity. Preferably, the gas-barrier film also has barrier properties to moisture.

Examples of polymeric gas-barrier films include ethyl vinyl alcohol copolymer (EVOH) films such as polyethylene EVOH films and polypropylene EVOH films; polyamide films such as coextruded polyamide/polyethylene films, coextruded polypropylene/polyamide/polypropylene films; and polyethylene films such as low density, medium density or high density polyethylene films and coextruded polyethylene/ethyl vinyl acetate films. Polymeric gas-barrier films can also be metallized, for example, coating a thin layer of metal such as aluminum on the polymer film.

Examples of inorganic gas-barrier films include films comprising silicon oxide, silicon nitride, silicon oxynitride, aluminum oxide, diamond-like films, diamond-like glass and foils such as aluminum foil.

Preferably, the gas-barrier film is flexible. For some applications, it is also preferable that the gas-barrier film be visible light-transmissive. As used herein, the term "visible light-transmissive" means having an average transmission over the visible portion of the spectrum (for example, between 400 nm and 700 nm) of at least about 80%, preferably at least about 88% or 90%.

For some applications, protection from moisture and oxygen is required. For particularly sensitive applications an "ultra-barrier film" may be necessary. Ultra-barrier films typically have an oxygen transmission rate less than about 0.005 $cc/m^2$/day at 23° C. and 90% RH and a water vapor transmission rate of less than about 0.005 g/m2/day at 23° C. and 90% RH.

Some ultra-barrier films are multilayer films comprising an inorganic visible light-transmissive layer disposed between polymer layers. One example of a suitable ultra-barrier film comprises a visible light-transmissive inorganic barrier layer disposed between polymers having a glass transition temperature (Tg) greater than or equal to that of heat-stabilized polyethylene terephthalate (HSPET).

A variety of polymers having a Tg greater than or equal to that of HSPET can be employed. Volatilizable monomers that form suitably high Tg polymers are especially preferred. Preferably the first polymer layer has a Tg greater than that of PMMA, more preferably a Tg of at least about 110° C., yet more preferably at least about 150° C., and most preferably at least about 200° C. Especially preferred monomers that can be used to form the first layer include urethane acrylates (e.g., CN-968, Tg=about 84° C. and CN-983, Tg=about 90° C., both commercially available from Sartomer Co.), isobornyl acrylate (e.g., SR-506, commercially available from Sartomer Co., Tg=about 88° C.), dipentaerythritol pentaacrylates (e.g., SR-399, commercially available from Sartomer Co., Tg=about 90° C.), epoxy acrylates blended with styrene (e.g., CN-120S80, commercially available from Sartomer Co., Tg=about 95° C.), di-trimethylolpropane tetraacrylates (e.g., SR-355, commercially available from Sartomer Co., Tg=about 98° C.), diethylene glycol diacrylates (e.g., SR-230, commercially available from Sartomer Co., Tg=about 100° C.), 1,3-butylene glycol diacrylate (e.g., SR-212, commercially available from Sartomer Co., Tg=about 101° C.), pentaacrylate esters (e.g., SR-9041, commercially available from Sartomer Co., Tg=about 102° C.), pentaerythritol tetraacrylates (e.g., SR-295, commercially available from Sartomer Co., Tg=about 103° C.), pentaerythritol triacrylates (e.g., SR-444, commercially available from Sartomer Co., Tg=about 103° C.), ethoxylated (3) trimethylolpropane triacrylates (e.g., SR-454, commercially available from Sartomer Co., Tg=about 103° C.), ethoxylated (3) trimethylolpropane triacrylates (e.g., SR-454HP, commercially available from Sartomer Co., Tg=about 103° C.), alkoxylated trifunctional acrylate esters (e.g., SR-9008, commercially available from Sartomer Co., Tg=about 103° C.), dipropylene glycol diacrylates (e.g., SR-508, commercially available from Sartomer Co., Tg=about 104° C.), neopentyl glycol diacrylates (e.g., SR-247, commercially available from Sartomer Co., Tg=about 107° C.), ethoxylated (4) bisphenol a dimethacrylates (e.g., CD-450, commercially available from Sartomer Co., Tg=about 108° C.), cyclohexane dimethanol diacrylate esters (e.g., CD-406, commercially available from Sartomer Co., Tg=about 110° C.), isobornyl methacrylate (e.g., SR-423, commercially available from Sartomer Co., Tg=about 110° C.), cyclic diacrylates (e.g., SR-833, commercially available from Sartomer Co., Tg=about 186° C.) and tris (2-hydroxy ethyl) isocyanurate triacrylate (e.g., SR-368, commercially available from Sartomer Co., Tg=about 272° C.), acrylates of the foregoing methacrylates and methacrylates of the foregoing acrylates.

The first polymer layer can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating) or spray coating (e.g., electrostatic spray coating), then crosslinked as set out above. The first polymer layer can also be formed by applying a layer containing an oligomer or polymer in solvent and drying the thus-applied layer to remove the solvent. Plasma polymerization may also be employed if it will provide a polymeric layer having a glassy state at an elevated temperature, with a glass transition temperature greater than or equal to that of HSPET. Most preferably, the first polymer layer is formed by flash evaporation and vapor deposition followed by crosslinking in situ, e.g., as described in U.S. Pat. No. 4,696,719 (Bischoff), U.S. Pat. No. 4,722,515 (Ham), US. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. Nos. 6,231,939 (Shaw et al.) and 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The smoothness and continuity of each polymer layer and its adhesion to the underlying layer preferably is enhanced by appropriate pretreatment. A preferred pretreatment regimen employs an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric layer. Plasma pretreatment is particularly preferred. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the first polymer layer will depend in part on the nature and surface topography of the support. The thickness preferably is sufficient to provide a smooth, defect-free surface to which the subsequent first inorganic barrier layer can be applied. For example, the first polymer layer may have a thickness of a few nm (e.g., 2 or 3 nm) to about 5 μm, and can be thicker if desired.

One or more visible light-transmissive inorganic barrier layers separated by a polymer layer having a Tg greater than or equal to that of HSPET lie atop the first polymer layer. These layers can respectively be referred to as the "first inorganic barrier layer", "second inorganic barrier layer" and "second polymer layer". Additional inorganic barrier layers and polymer layers can be present if desired, including polymer layers that do not have a Tg greater than or equal to that of HSPET. Preferably however each neighboring pair of inorganic barrier layers is separated only by a polymer layer or layers having a Tg greater than or equal to that of HSPET, and more preferably only by a polymer layer or layers having a Tg greater than that of PMMA.

The inorganic barrier layers do not have to be the same. A variety of inorganic barrier materials can be employed. Preferred inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers preferably are formed using techniques employed in the film metallizing art such as sputtering (e.g., cathode or planar magnetron sputtering), evaporation (e.g., resistive or electron beam evaporation), chemical vapor deposition, atomic layer deposition, plating and the like. Most preferably the inorganic barrier layers are formed using sputtering, e.g., reactive sputtering Enhanced barrier properties have been observed when the inorganic layer is formed by a high energy deposition technique such as sputtering compared to lower energy techniques such as conventional chemical vapor deposition processes. The smoothness and continuity of each inorganic barrier layer and its adhesion to the underlying layer can be enhanced by pretreatments (e.g., plasma pretreatment) such as those described above with reference to the first polymer layer.

The inorganic barrier layers do not have to have the same thickness. The desired chemical composition and thickness of each inorganic barrier layer will depend in part on the nature and surface topography of the underlying layer and on the desired optical properties for the barrier assembly. The inorganic barrier layers preferably are sufficiently thick so as to be continuous, and sufficiently thin so as to ensure that the barrier assembly and articles containing the assembly will have the desired degree of visible light transmission and flexibility. Preferably the physical thickness (as opposed to the optical thickness) of each inorganic barrier layer is about 3 to about 150 nm, more preferably about 4 to about 75 nm.

The second polymer layers that separate the first, second and any additional inorganic barrier layers do not have to be the same, and do not all have to have the same thickness. A variety of second polymer layer materials can be employed. Preferred second polymer layer materials include those mentioned above with respect to the first polymer layer. Preferably the second polymer layer or layers are applied by flash evaporation and vapor deposition followed by crosslinking in situ as described above with respect to the first polymer layer. A pretreatment such as those described above (e.g., plasma pretreatment) preferably also is employed prior to formation of a second polymer layer. The desired chemical composition and thickness of the second polymer layer or layers will depend in part on the nature and surface topography of the underlying layer(s). The second polymer layer thickness preferably is sufficient to provide a smooth, defect-free surface to which a subsequent inorganic barrier layer can be applied. Typically the second polymer layer or layers may have a lower thickness than the first polymer layer. For example, each second polymer layer may have a thickness of about 5 nm to about 10 μm, and can be thicker if desired.

Flexible visible light-transmissive ultra-barrier films and their manufacture are described, for example, in U.S. Pat. No. 7,940,004 (Padiyath et al.), which is herein incorporated by reference.

Commercially available ultra-barrier films include, for example, FTB 3-50 and FTB 3-125 available from 3M Company.

The gas-barrier film coated with a layer of the adhesive barrier composition of the invention may be provided on a substrate. The substrate is preferably flexible and visible light-transmissive. Suitable substrate materials include organic polymeric materials such as polyethylene terephthalate (PET), polyacrylates, polycarbonate, silicone, epoxy resins, silicone-functionalized epoxy resins, polyester such as Mylar (made by E. I. du Pont de Nemours & Co.), polyimide such as Kapton H or Kapton E (made by du Pont), Apical AV (made by Kanegafugi Chemical Industry Company), Upilex (made by UBE Industries, Ltd.), polyethersulfones (PES, made by Sumitomo), polyetherimide, polyethylenenaphthalene (PEN), polymethyl methacrylate, styrene/acrylonitrile, styrene/maleic anhydride, polyoxymethylene, polyvinylnaphthalene, polyetheretherketon, polyaryletherketone, high Tg fluoropolymers (for example, DYNEON™ HTE terpolymer of hexafluoropropylene, tetrafluoroethylene, and ethylene), poly α-methyl styrene, polyarylate, polysulfone, polyphenylene oxide, polyamideimide, polyimide, polyphthalamide, polyethylene, and polypropylene. Colorless polyimide, cyclic olefin copolymer and cyclic olefin copolymer can also be utilized. Preferably the substrate comprises PET.

FIG. 1 shows a cross-sectional structure of an exemplary barrier film construction 100 comprising substrate 110, gas-barrier film 120 (preferably, an ultra-barrier film), and barrier adhesive layer 130. In some embodiments, the barrier adhesive layer has a thickness of about 5 to about 50 µm. In some embodiments, the barrier film construction has a thickness of about 20 to about 250 µm.

In some embodiments, the outer surface of the barrier adhesive layer can be protected with means such as a release liner (140). Any useful release liner such as, for example, a film or sheet treated with a release agent (e.g., a silicone resin) can be used. The end user can remove the release liner to adhere the barrier construction to device it will protect.

Alternatively, the barrier adhesives of the invention can be provided to an end user disposed between two release liners.

The barrier film constructions of the invention can be used for protection from oxygen and moisture in OLED displays and solid state lighting, solar cells, electrophoretic and electrochromic displays, thin film batteries, quantum dot devices, sensor (e.g., touch sensor) and other organic electronic devices. They are especially well-suited for applications that require oxygen and moisture protection as well flexibility and good optical transmittance.

Figure 2:
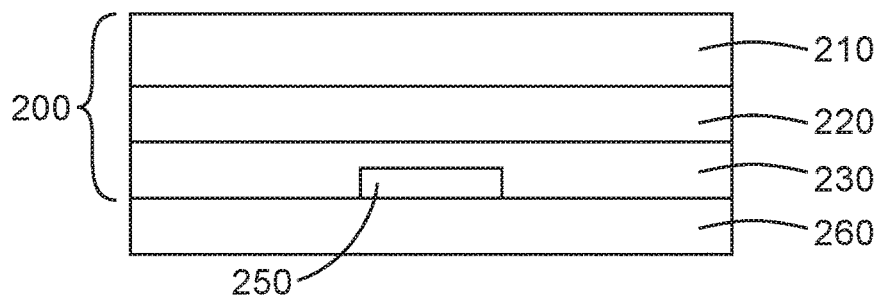
FIG. 2 is a schematic representation of an encapsulated organic device.

FIG. 2 shows a barrier film construction of the invention being used to encapsulate an organic electronic device such as, for example, an OLED. Organic electronic device 250 is disposed on device substrate 260. Organic electronic device 250 is encapsulated with barrier film construction 200, which includes ultra-barrier film 220, barrier adhesive layer 230 and substrate 210, and device substrate 260.

EXAMPLES

Objects and advantages of this invention are further illustrated by the following examples, but the particular materials and amounts thereof recited in these examples, as well as other conditions and details, should not be construed to unduly limit this invention. Unless otherwise noted, all parts, percentages, and ratios reported in the following examples are on a weight basis. Reagents were purchased from Sigma Aldrich Company, St. Louis, Mo., unless otherwise noted.

TABLE 1

Material and sources.

| Material | Trade name or abbreviation | Source (Location) |
|---|---|---|
| Polyisobutylene, 800,000 g/mol | Oppanol B80 | BASF Corporation (Florham Park, NJ) |
| Polyisobutylene, 400,000 g/mol | Oppanol B50SF | BASF Corporation (Florham Park, NJ) |
| Cycloaliphatic hydrocarbon resin tackifier | Escorez 5300 | ExxonMobil Chemical Company (Houston, TX) |
| Release liner | SKC-12N | SKC Haas (Seoul, Korea) |
| Release liner | SKC-02N | SKC Haas (Seoul, Korea) |
| Release liner | M74F | Siliconature (Godega di Sant'Urbano, Italy) |
| 3M Ultrabarrier Film | FTB3-50 | 3M Company (Saint Paul, MN) |
| Calcium oxide nanopowder with particle size less than 160 nm | Catalog number 634182 | Sigma-Aldrich (St. Louis, MO) |
| Organophilic bentonite clay | Claytone APA | BYK (Wesel, Germany) |
| n-Heptane | | Sigma-Aldrich (St. Louis, MO) |
| Toluene | | VWR International (Radnor, PA) |
| 1-Methoxy propanol | | Sigma-Aldrich (St. Louis, MO) |

Optical Properties Characterization.

Transmission, clarity, and haze data were acquired using a BYK Gardner Haze-Gard Plus (BYK-Gardner USA, Inc., Columbia, Md.).

Moisture Barrier Testing

Barrier assemblies were tested for their ability to prevent the transport of moisture or water vapor by laminating the barrier assemblies to glass on which elemental calcium had been deposited to produce test specimens. These test specimens were then exposed to elevated temperature and humidity and the optical density loss due to the reaction of elemental calcium with water was measured. Each barrier assembly was first baked in vacuum at 80° C. to ensure any residual moisture was removed. Calcium (reflective metallic) was thermally deposited on specified regions of a glass plate as an array of squares. Each barrier assembly was disposed on the glass plate over four calcium squares (referred to as pixels), and this assembly was laminated to provide a test specimen. Using an Epson v750 Professional to scan the test specimens and Aphelion image analysis software to analyze the scan, the optical density of each calcium pixel of each freshly made test specimen was measured. Each test specimen was then placed in an envi ronmental chamber for accelerated aging at 60° C. and 90% relative humidity. For the first three days, optical densities were measured twice per day. Optical density was then measured once per day until the optical density was 50% of the initial density. The water vapor transport rate (WVTR) is inversely proportional to the time needed for the optical density of a calcium pixel to reach 50% of its initial value. This relationship is described by the following equation:

$$WVTR = \frac{d_{Ca}\rho_{Ca}}{t_i}\left(\frac{n_{Ca}}{MW_{Ca}}\right)\left(\frac{MW_{H_2O}}{n_{H_2O}}\right)$$

Where $d_{ca}$ is the thickness of the calcium layer;
$P_{ca}$ is the density of calcium;
$t_i$ is time;
$n_{H_2O}$ is the number of moles of water;
$n_{ca}$ is the number of moles of calcium;
$MW_{H_2O}$ is the molecular weight of water; and,
$MW_{ca}$ is the molecular weight of calcium.

Preparative Example 1

Polyisobutylene-Based Adhesive Mixture

Bulk Oppanol B80 and Oppanol B50SF polyisobutylene polymer resins were diced into approximately 1 inch (2.5 cm) cubes. Weighed amounts of these resin cubes were then combined in toluene with Escorez 5300 tackifier in a capped glass jar. The weight ratio of the adhesive mixture was two parts Oppanol B80, one part Oppanol B50SF, and one part Escorez 5300 in sufficient toluene to provide a 25 wt. % solution. The resulting formulation was mixed using a roller mixer for 2 weeks until the solution was homogeneous.

Preparative Examples 2-4

Nanoparticle Dispersions

The nanoparticles were calcium oxide nanopowder (CaO) and Claytone APA ("clay"), which were added to toluene at the weight ratios provided in Table 2. The nanoparticles were added directly to the toluene at 5 wt. % solids and then dispersed using a Sonics Vibra Cell VCX750 sonicator (Sonics & Materials Inc., Newtown, Conn.) at 18-20% amplitude for 20 minutes.

TABLE 2

Ratio of nanoparticles in dispersions used in this work.

| Preparative Example | Weight Ratios | |
|---|---|---|
| | CaO | Claytone APA |
| PE2 | 1 | 0 |
| PE3 | 0 | 1 |
| PE4 | 1 | 5 |

Preparative Examples 5-9

Nanoparticle-filled Adhesive Formulations

The nanoparticle dispersions of Preparative Examples 2-4 were combined with the polyisobutylene-based polymer solution of Preparative Example 1 in the weight ratios provided in Table 3. The resulting formulations were mixed using a roller mixer for one week. The resulting solutions were diluted with toluene to reach a final solids content of 20 wt. % solids.

TABLE 3

Composition of nanoparticle-filled polyisobutylene-based adhesive formulations.

| Preparative Example | Polymeric Binder | Nanoparticle Dispersion | Polymer/nanoparticles (weight ratio) |
|---|---|---|---|
| Preparative Example 5 | Preparative Example 1 | Preparative Example 2 | 99:1 |
| Preparative Example 6 | Preparative Example 1 | Preparative Example 2 | 98:2 |
| Preparative Example 7 | Preparative Example 1 | Preparative Example 3 | 90:10 |
| Preparative Example 8 | Preparative Example 1 | Preparative Example 4 | 94:6 |

To prepare adhesive films, the nanoparticle-filled adhesive formulations of Preparative Examples 5-9 were applied to SKC-12N release liner using a benchtop notch bar coater. The coated release liners were placed in an oven at 80° C. for 20 minutes to remove the solvent, providing adhesive films having 12 micrometer thickness. Afterwards, either M74F or SKC-02N release liner was laminated to the adhesive such that the adhesive was sandwiched between the two release liners. The adhesive was later transferred to 3M FTB3-50 Ultrabarrier film by removing either the M74F or SKC-02N release liner and laminating the adhesive to the barrier layer side of the Ultrabarrier film to provide barrier assemblies. The compositions of the adhesives used in making the barrier assemblies that were tested are provided in Table 4. The adhesive comprising polyisobutylene but containing no nanoparticles is referred to as PIB in the Tables,

TABLE 4

Adhesive compositions.

| Adhesive Example | Adhesive Formulation | Adhesive Composition (weight ratio) |
|---|---|---|
| Comparative Example 1 | PE1 | PIB |
| Comparative Example 2 | PE3 | 99:1 PIB:CaO |

TABLE 4-continued

Adhesive compositions.

| Adhesive Example | Adhesive Formulation | Adhesive Composition (weight ratio) |
|---|---|---|
| Comparative Example 3 | PE4 | 98:2 PIB:CaO |
| Comparative Example 4 | PE7 | 90:10 PIB:Clay |
| Example | PE8 | 94:5:1 PIB:Clay:CaO |

Figure 3:
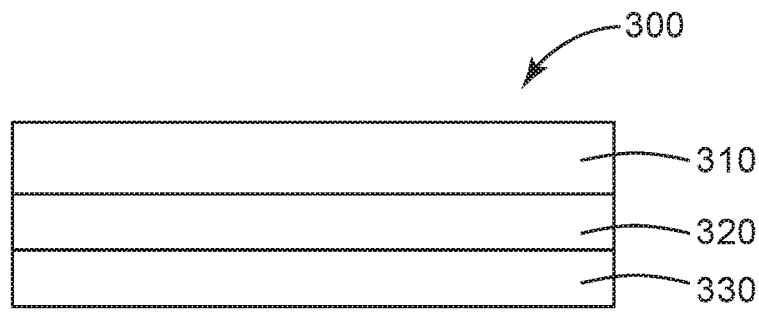
FIG. 3 is a schematic representation of a barrier film construction utilized in the Examples.
Figure 4:
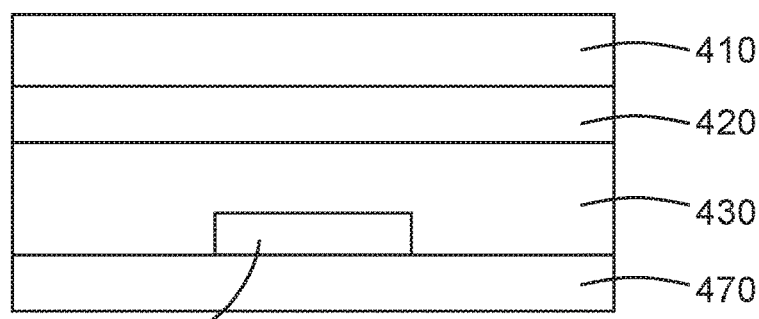
FIG. 4 is a schematic representation of the laminate construction used for calcium testing in the Examples.
Figure 5:
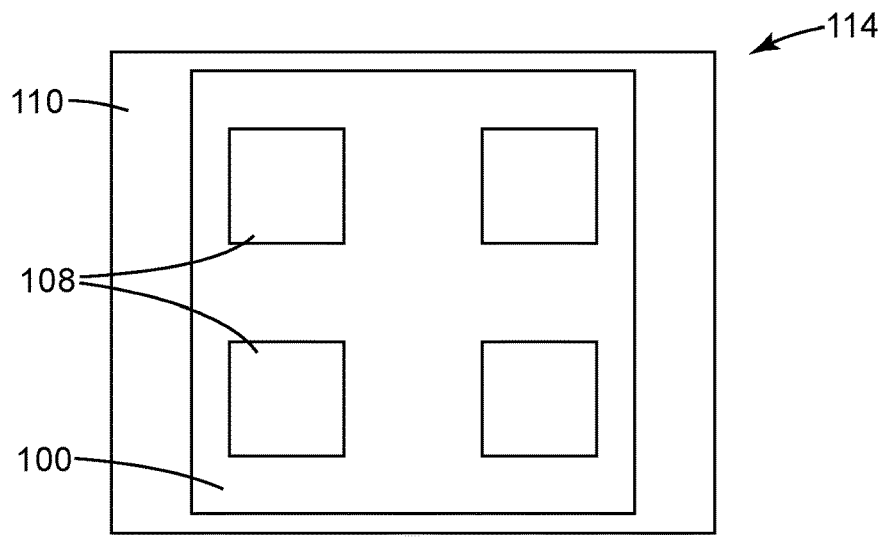
FIG. 5 is a plan view of the laminate construction used for calcium testing in the Examples.
Figure 6:
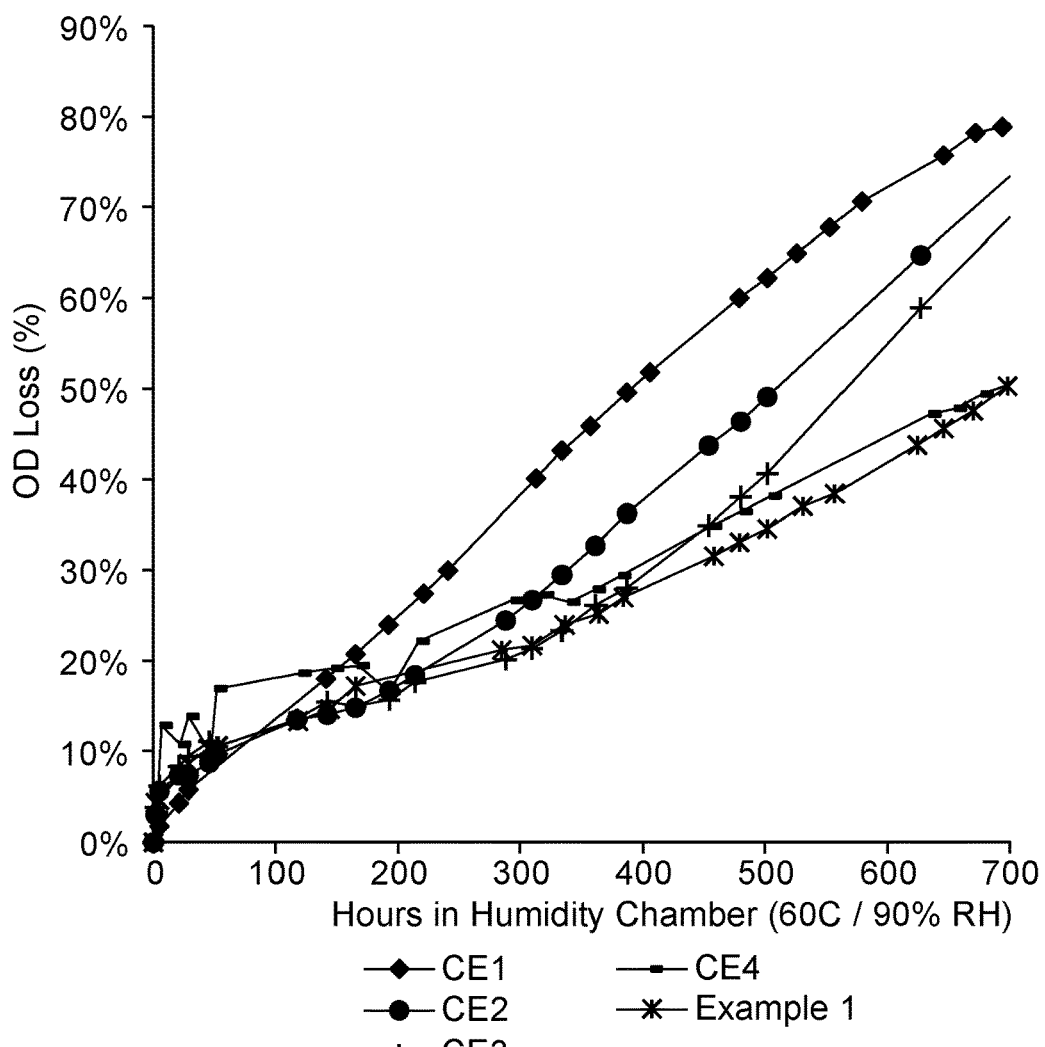
FIG. 6 is a plot of percent optical density loss over time under accelerated aging conditions.

Accelerated Aging of Test specimens Test specimens for accelerated aging testing were prepared and tested as shown in FIGS. 3-5 (where 470, 570 is the glass substrate and 480, 580 is calcium) and previously described in Moisture Barrier Testing. The accelerated aging test results for the test specimens are summarized in Table 5 and FIG. 6. As shown in Table 5, the time to 50% optical density loss is longer for test specimens containing either of the two nanoparticle types (Comparative Examples 2-5) compared to the unfilled adhesive (Comparative Example 1). The Example, comprising 5 wt. % clay and 1 wt. % CaO in combination, shows an increased time to 50% optical density loss compared to Comparative Examples comprising 10 wt. % clay alone or 1 wt. % CaO alone. The differentiation becomes apparent after 300 hours accelerated aging.

TABLE 5

Time to 50% Optical Density Loss for Comparative Examples 1-5 and the Example.

| Adhesive | Adhesive Descriptor | Time to 50% Optical Density Loss (hours) |
|---|---|---|
| Comparative Example 1 | PIB | 390 |
| Comparative Example 2 | 99:1 PIB:CaO | 510 |
| Comparative Example 3 | 98:2 PIB:CaO | 570 |
| Comparative Example 4 | 90:10 PIB:Clay | 690 |
| Example | 94:5:1 PIB:Clay:CaO | 700 |

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A barrier adhesive composition comprising:
   (a) polyisobutylene resin having a viscosity average molecular weight of about 300,000 to about 900,000 g/mol;
   (b) organically modified nanoclay; and
   (c) sorbent nanoparticles having an average particle size of no greater than about 200 nm.

2. The barrier adhesive composition of claim 1 wherein the nanoclay is a bentonite nanoclay or a montmorillonite nanoclay.

3. The barrier adhesive composition of claim 1 wherein the nanoclay is about 100 to about 1000 nm in its longest dimension.

4. The barrier adhesive composition of claim 1 wherein the nanoclay is modified with a quaternary ammonium ion.

5. The barrier adhesive composition of claim 1 wherein the sorbent nanoparticles comprise metal oxide.

6. The barrier adhesive composition of claim 5 wherein the sorbent nanoparticles comprise calcium oxide.

7. The barrier adhesive composition of claim 1 comprising about 1 to about 10 wt. % of the organically modified nanoclay relative to the total weight of the composition.

8. The barrier adhesive composition of claim 7 comprising about 2 to about 5 wt. % of the organically modified nanoclay relative to the total weight of the composition.

9. The barrier adhesive composition of claim 1 comprising about 0.5 to about 10 wt. % of the sorbent nanoparticles relative to the total weight of the composition.

10. The barrier adhesive composition of claim 9 comprising about 1 to about 5 wt. % of the sorbent nanoparticles relative to the total weight of the composition.

11. The barrier adhesive composition of claim 1 further comprising solvent.

12. The barrier adhesive composition of claim 1 further comprising ultraviolet blocker.

13. The barrier adhesive composition of claim 1 further comprising tackifier.

14. The barrier adhesive composition of claim 1 wherein the polyisobutylene resin comprises isobutylene copolymer.

15. The barrier adhesive composition of claim 14 wherein the polyisobutylene resin comprises butyl rubber.

16. A barrier adhesive composition comprising:
   (a) about 50 to about 75 wt. % polyisobutylene resin having a viscosity average molecular weight of about 300,000 to about 900,000 g/mol,
   (b) about 1 to about 10 wt. % organically modified nanoclay,
   (c) about 1 to about 5 wt. % calcium oxide nanoparticles, and
   (d) about 10 to about 25 wt. % tackifier all relative to the total weight of the composition.

17. An adhesive barrier film comprising a layer of the barrier adhesive composition of claim 1 disposed on a gas-barrier film.

18. The adhesive barrier film of claim 17 wherein the gas-barrier film is an ultra-barrier film having an oxygen transmission rate less than about 0.005 $cc/m^2/day$ at 23° C. and 90% RH and a water vapor transmission rate of less than about 0.005 g/m2/day at 23° C. and 90% RH.

19. The adhesive barrier film of claim 18 wherein the ultra-barrier film is a multilayer film comprising an inorganic visible light-transmissive layer disposed between polymer layers.

20. The adhesive barrier film of claim 17 further comprising a substrate disposed on the gas-barrier film opposite the layer of the barrier adhesive composition.

21. The adhesive barrier film of claim 20 wherein the substrate comprises polyethylene terephthalate.

22. The adhesive barrier film of claim 17 further comprising a release layer disposed on the layer of the barrier adhesive composition opposite the gas-barrier film.

23. An encapsulated organic electronic device comprising the barrier adhesive composition of claim 1 encapsulating a thin film device.

24. The encapsulated organic electronic device of claim 23 wherein the device is an OLED.

25. An encapsulated touch sensor comprising the barrier adhesive composition of claim 1 encapsulating a touch sensor.

26. A barrier adhesive article comprising a layer of the barrier adhesive composition of claim 1 disposed between release layers.

* * * * *